United States Patent [19]
Lu

[11] Patent Number: 5,216,303
[45] Date of Patent: Jun. 1, 1993

[54] DOUBLE SOLID STATE RELAY

[76] Inventor: Chao-Cheng Lu, 4-4 Alley 27, Lane 143 Chun Kung Road, Taipei 11614, Taiwan

[21] Appl. No.: 740,819

[22] Filed: Aug. 6, 1991

[51] Int. Cl.$^5$ ............................................. H03K 17/72
[52] U.S. Cl. ................................. 307/632; 307/113; 307/311; 307/647
[58] Field of Search ............... 307/632, 647, 113, 311; 323/319, 325, 349, 350

[56] References Cited

U.S. PATENT DOCUMENTS

| | | | |
|---|---|---|---|
| 4,324,989 | 4/1982 | Stut | 307/632 |
| 4,710,949 | 12/1987 | Ahuja | 307/632 |

FOREIGN PATENT DOCUMENTS

| | | | |
|---|---|---|---|
| 2528658 | 1/1977 | Fed. Rep. of Germany | 307/632 |
| 0007017 | 1/1988 | Japan | 307/632 |

Primary Examiner—John Zazworsky
Attorney, Agent, or Firm—Jacobson, Price, Holman & Stern

[57] ABSTRACT

A new double solid state relay comprising two sets of solid state relays and being constructed in such a way that it can turn on and off a circuit with a voltage very close to zero. It is the only solid type double solid state relay in the world and is safe enough for popular use in the industry.

12 Claims, 2 Drawing Sheets

DOUBLE SOLID STATE RELAY

BACKGROUND OF THE INVENTION

A zero voltage closing solid state relay can be made of two control circuits plus a full wave rectifier, TRIAC thyristor and zero voltage closing circuit. An interlock type double solid state relay in accordance with the present invention is made by adding another solid state relay to the full wave rectifier circuit of the zero voltage closing solid state relay.

SUMMARY OF THE INVENTION

This invention relates to a zero voltage closing double solid state relay which comprises control circuits, full wave rectifiers, TRIAC thyristor circuits and zero voltage closing circuits, arranged as follows:

The control circuits, which comprise optical coupler ICs, resistors, diodes, transistors and Darlington circuits, are designed to control the on-off operation of the TRIAC thyristor circuits. In accordance with the present invention, there are two such control circuits. It should be noted, however, that in order to meet the requirements of this invention, the Darlington circuit can be replaced by a silicon controlled rectifier.

Additionally, a pair of AC on-off circuits are defined by two full wave rectifiers, the TRIAC thyristors and metal oxide varistors. The on-off circuits are designed to be controlled by the control circuits so that the on-off operation and the AC power source can be controlled. This invention has two sets of AC on-off circuits.

Zero voltage closing circuits, on the other hand, comprise resistors, zener diodes and transistors, and are designed to make the AC on-off circuit turn on or off with a voltage which is close to zero. Of course, in order for the AC on-off circuit to turn on or off, the voltage must be at least high enough to turn the circuit on.

DETAILED DESCRIPTION OF THE DRAWINGS

Figure 1:
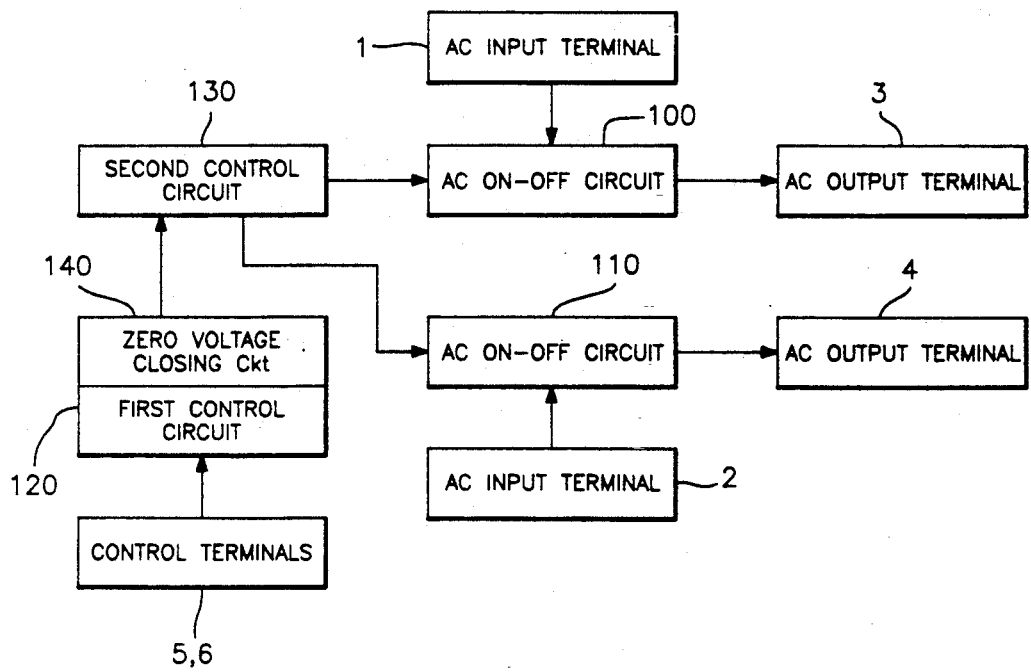
FIG. 1 is a block diagram of the new double solid state relay.
Figure 2:
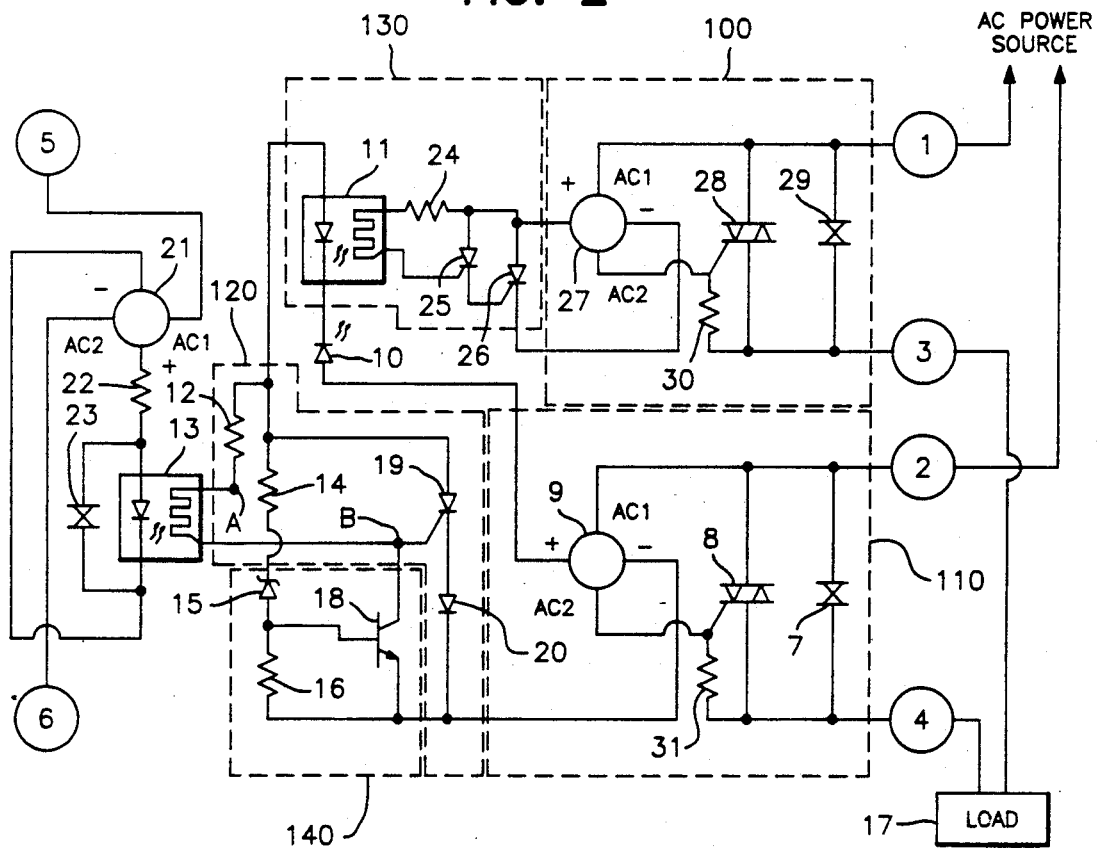
FIG. 2 is a circuit diagram of the relay which includes a cadmium sulfide optical coupler.
Figure 3:
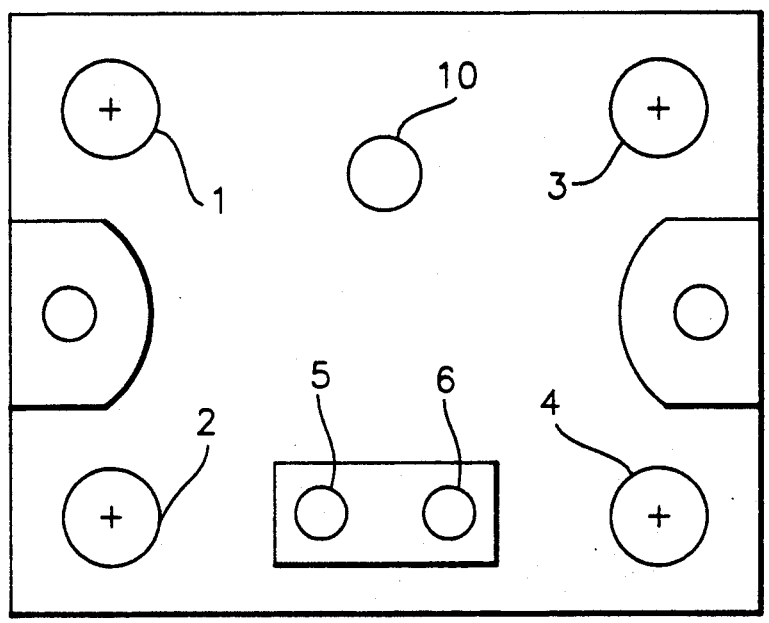
FIG. 3 is an external wiring diagram of the relay.

With reference to FIGS. 1-3, a preferred embodiment of the double solid state relay will now be described. According to the preferred embodiment, a zero voltage closing double solid state relay comprises a pair of input terminals 1,2; a pair of output terminals 3,4; a pair of AC on-off circuits 100,110 for selectively electrically connecting the input terminals 1,2 to the output terminals 3,4 respectively; a pair of control terminals 5,6 for receiving an AC or DC voltage indicative of whether said solid state relay is to be turned on; a first control circuit 120 responsive to the pair of control terminals 5,6 and connected to one of the AC on-off circuits 110 for controlling the AC on-off circuit 110 in accordance with the presence of an AC or DC voltage across the pair of control terminals 5,6; a second control circuit 130 connected to the other AC on-off circuit 100 and the first control circuit 120 and also responsive to the pair of control terminals 5,6 for controlling the other AC on-off circuit 100 in accordance with the presence of an AC or DC voltage across the pair of control terminals 5,6; and a zero voltage closing circuit 140 connected to the first control circuit 120 for causing the first and second control circuits 120,130 to effect control of the AC on-off circuits 110,110 when the voltage across the input terminals 1,2 is close to zero.

According to the preferred embodiment, the relay further comprises an optical coupler IC 13 for optically coupling the pair of control terminals 5,6 to both control circuits 120,130 and to the zero voltage closing circuit 140. In addition, a bridge rectifier 21 is electrically connected between the optical coupler IC 13 and the pair of control terminals 5,6 for rectifying electrical signals received through the control terminals 5,6 so that both AC and DC voltages can be used to activate the relay.

As FIG. 2 indicates, each of the AC on-off circuits 100,110 respectively comprises a full wave rectifier 27,9; a TRIAC thyristor 28,8; and a metal oxide varistor 29,7.

In the AC on-off circuit 100, the positive and negative terminals of the full wave rectifier 27 are connected to the second control circuit 130, while the AC terminals AC1, AC2 are connected to the input terminal 1 and the gate of the TRIAC thyristor 28, respectively. A resistor 30 is connected from the gate of the TRIAC thyristor 28 to the output terminal 3. The anodes of the TRIAC thyristor 28 and the metal oxide varistor 29 are connected in parallel across the input terminal 1 and output terminal 3.

With regard to the other AC on-off circuit 110, the positive terminal of the full wave rectifier 9 is connected, through an LED 10 and the LED of an optical coupler IC 11, to the first control circuit 120, while the negative terminal of the full wave rectifier 9 is connected to the first control circuit 120 directly. The AC terminals AC1,AC2 of the full wave rectifier 9 are connected to the input terminal 2 and to the gate of the TRIAC thyristor 8, respectively. A resistor 31 is connected from the gate of the TRIAC thyristor 8 to the output terminal 4.

The first control circuit 120 comprises a first resistor 12, a second resistor 14, a diode 20, and an SCR 19. The SCR 19 has a gate electrically connected to the optical coupler IC 13 and to the zero voltage closing circuit 140, as well as a cathode electrically connected, through the diode 20, to the second AC on-off circuit 110 and the zero voltage closing circuit 140. The anode of the SCR 19 is electrically connected, through the LED of optical coupler IC 11 and LED 10, to the second AC on-off circuit 110. The anode of the SCR 19 is further connected, through the first resistor 12, to the optical coupler IC 13, and through the second resistor 14, to the zero voltage closing circuit 140.

The second control circuit 130 comprises the optical coupler IC 11, a resistor 24, and a darlington circuit. The darlington circuit itself comprises two SCRs 25 and 26. The gate of SCR 25 is connected to the optical coupler IC 11 which is, in turn, connected to the anode of SCR 25 through a resistor 24. The cathode of SCR 25 is connected to the gate of SCR 26. Similarly, the anodes of both SCRs 25 and 26 are commonly connected to the positive terminal of the full wave rectifier 27, while the cathode of SCR 26 is connected to the negative terminal of the full wave rectifier 27.

The zero voltage closing circuit 140 comprises a zener diode 15, a transistor 18, and a resistor 16. In particular, the cathode of the zener diode 15 is electrically connected, through the resistor 14, to the anode of the SCR 19. The emitter of transistor 18 is electrically connected to the cathode of the diode 20, while the collector is connected to the gate of the SCR 19. The base of transistor 18 is electrically connected to the anode of the zener diode 15 and, through the resistor 16, to the emitter of the transistor 18.

As FIG. 2 indicates, the preferred embodiment also includes a metal oxide varistor 23 connected in parallel to the LED of the optical coupler IC 13.

Since the TRIAC thyristor is double throw, the input terminals 1 and 2 of the AC power source can be changed to load terminals 17, while the output terminals 3 and 4 of AC power source can be changed to input terminals without restriction. If the voltage from the AC power source is applied to the terminal 2, it likewise appears at three different points in the circuit, namely, at the metal oxide varistor 7, at the MT2 of the TRIAC thyristor 8 and at the ACI of the bridge rectifier 9. The voltage will also go through the light emitting diode 10 and through the positive terminal (P. Junction) and negative terminal of the light emitting diode of the optical coupler IC 11 to the first control circuit. At this time, an AC voltage goes through the AC1 of the bridge rectifier 21, through the positive terminal of the rectifier 21 and through the resistor 22 to the positive terminal of the optical coupler IC 13. The AC voltage then returns to the AC2 and the control terminal 6 through the negative terminal of the optical coupler IC 13 thereby completing a circuit. As a result, the cadmium sulfide (CDS) of the optical coupler IC 13 is on and the full wave rectifier 9 voltage goes through the resistor 12 and the CDS of optical coupler IC 13 to the gate of the silicon controlled rectifier (SCR) 19. This, in turn, causes the SCR 19 to go on. Once this occurs, the full wave rectifier voltage goes through the anode of the SCR 19 to the cathode of the SCR 19, goes through the diode 20, and returns to the negative terminal of the full wave rectifier 9 thereby sending the AC voltage from the input terminal of full wave rectifier 9 to the gate of the TRIAC thyristor 8 and making the TRIAC thyristor 8 turn on. Hence, AC power coming through the input terminal 2 from the AC power source, goes through the TRIAC thyristor 8 to the output terminal 4 thereby completing a circuit. When this occurs, the sinusoidal voltage present at the input terminal 2 passes through the full wave rectifier and appears after rectification at the anode of the SCR 19. As this sinusoidal voltage progresses from zero to the maximum, the gate of SCR 19 is controlled by the saturation and cutoff of the collector and emitter of the transistor 18. When the sinusoidal voltage is rising from zero, the voltage goes from the voltage drop resistor 14 to the positive terminal (P junction) of the zener diode 15. The sinusoidal voltage, likewise, goes from the CDS of optical coupler IC 13 to the gate of the SCR 19 and the collector of transistor 18. The breakdown voltage of the zener diode 15 is set higher than the turn-on voltage of the SCR 19 so that the SCR 19 can be turned on. In this regard, the turn on point of SCR 19 depends on the breakdown voltage of the zener diode 15. When the sinusoidal voltage is higher than the breakdown voltage of zener diode 15, the two terminals of the resistor 16 supply a voltage to the base of the transistor 18 thereby causing the collector and emitter of the transistor 18 to become saturated. As a result, as soon as the current flowing from the anode to the cathode drops below the holding current of the SCR 19, the SCR 19 goes off to protect the load. Specifically, this causes the voltage at the two terminals of the load to start from a zero sine voltage. This is the zero voltage closing principle of the present invention. When there is no voltage supplied to the control terminals 5 and 6, the AC voltage is terminated at the zero voltage point of the sine wave.

When the voltage from the AC power source is applied to the input terminal 1, it likewise appears at three different points in the circuit, namely, at the metal oxide varistor 29, at the MT2 of the TRIAC thyristor 28, and at the AC1 of the bridge rectifier 27. The positive terminal of the bridge rectifier 27 sends a full wave rectifier voltage to the anode of the Darlington circuit of the second control circuit. The Darlington circuit itself comprises two silicon controlled rectifiers 25 and 26. However, it is well understood that the SCRs 25 and 26 can be replaced with transistors to thereby achieve the same results. When the control terminals 5 and 6 receive an AC or DC voltage, the bridge rectifier 21 provides whatever rectification may be necessary to achieve a positive voltage across the LED of the optical coupler IC 13. The LED of the optical coupler IC 13 is thus illuminated, while the optical coupler IC 13 communicates this condition to the rest of the solid state relay. As a result, activation of the double solid state relay of the present invention is achieved and AC power begins to flow from the input terminals 1 and 2 to the output terminals 3 and 4. More specifically, the light emitting diode 10 and the light emitting diode of the optical coupler IC 11 go on, as does the CDS of the optical coupler IC 11. After amplification, the Darlington circuit becomes saturated. At this time, the voltage from the positive terminal of the bridge rectifier 27 goes through the Darlington circuit to the negative terminal of the bridge rectifier, and as a result, the two AC terminals of the bridge rectifier 27 are on. The AC voltage then goes to the gate of the TRIAC thyristor 28 and thereby causes the TRIAC thyristor 28 MT1 to turn on. In this manner, the AC voltage is sent from the input terminal, to the output terminal 3 and the interlock function of the present invention is thereby achieved. The term "interlock function" refers to the fact that whenever one AC on-off circuit is activated, the other AC on-off circuit is also activated. If, however, the control terminals 5 and 6 receive no AC or DC voltage, the AC voltage of the input terminal stops going to the output terminal 3.

The voltage between the gate and MT1 of the TRIAC thyristor 8 is obtained from the voltage drop across the two terminals of the resistor 31. Likewise, the voltage between the gate and MT1 of the other TRIAC thyristor 28 is obtained from the voltage drop across two terminals of the other resistor 30.

Structurally, a conventional solid state relay only has two sets of input and output terminals. By contrast, the double solid state relay of this invention, as shown in FIG. 3, has two sets of input and output terminals 1,2 and 3,4 respectively; one set of control terminals 5,6 and one LED 10 to indicate the function and on-off of the double solid state relay. The LED 10 itself provides a visual indication of the solid state relay's operation.

In practice, the terminals 1, 2, 3, 4, 5 and 6 may comprise any commercially available or generally known terminal structure or composition. With regard to function, the reference numerals in FIG. 3 correspond directly with the reference numerals of FIG. 2. Accordingly, the function of each element in FIG. 3 is known from the description of the corresponding element in FIG. 2.

The foregoing description is intended by way of example only and is not intended to limit the present invention in any way except a set forth in the following claims.

I claim:

1. A zero voltage closing double solid state relay comprising:

first and second input terminals;

first and second output terminals;

a first AC on-off circuit for selectively electrically connecting said first input terminal to said first output terminal, said first AC on-off circuit being electrically connected between said first input terminal and said first output terminal;

a second AC on-off circuit for selectively electrically connecting said second input terminal to said second output terminal, said second AC on-off circuit being electrically connected between said second input terminal and said second output terminal;

a pair of control terminals for receiving an AC or DC voltage indicative of whether said solid state relay is to be turned on;

a first control circuit for controlling said second AC on-off circuit in accordance with the presence of said AC or DC voltage across said pair of control terminals, said first control circuit being connected to said second AC on-off circuit and coupled to said pair of control terminals so as to be responsive to said pair of control terminals; a second control circuit for controlling said first AC on-off circuit in accordance with the presence of said AC or DC voltage across said pair of control terminals, said second control circuit being connected to said first AC on-off circuit and responsive to said pair of control terminals, said second control circuit being further connected to said first control circuit; and a zero voltage closing circuit connected to said first control circuit for enabling said first and second control circuits to control the first and second AC on-off circuits when a voltage across the first and second input terminals is close to zero.

2. The zero voltage closing double solid state relay of claim 1, further comprising an optical coupling means for optically coupling said pair of control terminals to said first control circuit, said second control circuit and said zero voltage closing circuit, said optical coupling means being electrically connected between said pair of control terminals and said first control circuit.

3. The zero voltage closing double solid state relay of claim 2, further comprising full wave rectifying means electrically connected between said optical coupling means and said pair of control terminals, for rectifying electrical signals received through said pair of control terminals so that both AC and DC voltages can be used to activate said relay.

4. The zero voltage closing double solid state relay of claim 2, wherein said optical coupling means comprises a light emitting diode and a cadmium sulfide means responsive thereto.

5. The zero voltage closing double solid state relay of claim 1, wherein said first AC on-off circuit comprises:

a TRIAC switch having a first anode electrically connected to the first input terminal, a second anode electrically connected to the first output terminal, and a gate electrically connected through a resistor to said first output terminal;

a metal oxide varistor electrically connected from said first input terminal to said first output terminal; and a full wave rectifying means having a first AC terminal electrically connected to the first input terminal, a second AC terminal electrically connected between said gate and said resistor, a negative terminal electrically connected to the second control circuit, and a positive terminal also electrically connected to the second control circuit.

6. The zero voltage closing double solid state relay of claim 1, wherein said second AC on-off circuit comprises:

a TRIAC switch having a first anode electrically connected to the second input terminal, a second anode electrically connected to the second output terminal, and a gate electrically connected through a resistor to said second output terminal;

a metal oxide varistor electrically connected from said second input terminal to said second output terminal; and a full wave rectifying means having a first AC terminal electrically connected to the second input terminal, a second AC terminal electrically connected between said gate and said resistor, a negative terminal electrically connected to the first control circuit and the zero voltage closing circuit, and a positive terminal electrically connected, through the second control circuit, to the first control circuit and the zero voltage closing circuit.

7. The zero voltage closing double solid state relay of claim 1, wherein said second control circuit comprises:

a Darlington circuit electrically connected to the first AC on-off circuit; and an optical coupling means electrically connected to said Darlington circuit through a resistor, said optical coupling means being responsive to the first control circuit and the zero voltage closing circuit so as to control the operation of the Darlington circuit.

8. The zero voltage closing double solid state relay of claim 7, wherein said Darlington circuit comprises:

a first silicon controlled rectifier having a gate electrically connected to the optical coupling means and an anode electrically connected to the first AC on-off circuit; and a second silicon control rectifier having an anode electrically connected to said first AC on-off circuit, a cathode also electrically connected to said first AC on-off circuit, and a gate electrically connected to the cathode of said first silicon controlled rectifier.

9. The zero voltage closing double solid state relay of claim 2, wherein said first control circuit comprises a first resistor, a second resistor, a diode, and a silicon controlled rectifier, said silicon controlled rectifier having:

a gate electrically connected to the optical coupling means and to the zero voltage closing circuit;

an anode electrically connected, through the second control circuit, to the second AC on-off circuit, said anode also being electrically connected, through said first resistor, to the optical coupling means, said anode further being electrically connected, through said second resistor, to the zero voltage closing circuit; and a cathode electrically connected, through said diode, to the second AC on-off circuit and to the zero voltage closing circuit.

10. The zero voltage closing double solid state relay of claim 9, wherein said zero voltage closing circuit comprises a zener diode, a third resistor, and a transistor, said zener diode having a cathode electrically connected through said second resistor to the anode of said silicon controlled rectifier, said transistor having:

an emitter electrically connected to the cathode of said diode in said first control circuit;

a collector electrically connected to the gate of said silicon controlled rectifier; and a base electrically connected to the anode of said zener diode, and also electrically connected, through said third resistor, to said emitter.

11. The zero voltage closing double solid state relay of claim 1, wherein said first and second input terminals are electrically connected to and AC power source, and said first and second output terminals are electrically connected to an electrical load.

12. The zero voltage closing double solid state relay of claim 1, further comprising a light emitting diode for providing a visual indication of the solid state relay's operation, said light emitting diode being electrically connected between the second AC on-off circuit and the second control circuit.

* * * * *

UNITED STATES PATENT AND TRADEMARK OFFICE
CERTIFICATE OF CORRECTION

PATENT NO. : 5,216,303

DATED : June 1, 1993

INVENTOR(S) : Chao-Cheng Lu

It is certified that error appears in the above-identified patent and that said Letters Patent is hereby corrected as shown below:

In the drawings, Sheet 1, Figure 2, the connection of the light emitting diode in the optical coupler IC 11 should be reversed such that the n-type material of the diode is electrically connected to the first control circuit 120, and the p-type material of the diode is electrically connected to the n-type material of the light emitting diode 10.

Signed and Sealed this

Twenty-second Day of February, 1994

Attest:

BRUCE LEHMAN

Attesting Officer                Commissioner of Patents and Trademarks